United States Patent [19]

Martin

[11] Patent Number: 4,489,303
[45] Date of Patent: Dec. 18, 1984

[54] CONTACTLESS SWITCH AND JOYSTICK CONTROLLER USING HALL ELEMENTS

[75] Inventor: Thomas B. Martin, Tyler, Tex.

[73] Assignee: Advanced Control Systems, Tyler, Tex.

[21] Appl. No.: 500,845

[22] Filed: Jun. 3, 1983

[51] Int. Cl.³ ............................................. H01L 43/06
[52] U.S. Cl. ................... 338/128; 338/32 H;
200/6 A; 74/471 XY; 273/148 B
[58] Field of Search ............. 338/128, 32 H; 200/6 A;
324/251; 74/471 XY; 273/148 B

[56] References Cited

U.S. PATENT DOCUMENTS

| | | | |
|---|---|---|---|
| 3,331,971 | 7/1967 | Möller | 338/32 H X |
| 3,611,358 | 10/1971 | Dalmasso | 338/32 H X |
| 3,882,337 | 5/1975 | Pfeffer et al. | 338/32 H X |
| 4,107,604 | 8/1978 | Bernier | 338/32 H X |

FOREIGN PATENT DOCUMENTS

| | | | |
|---|---|---|---|
| 2242178 | 7/1972 | Fed. Rep. of Germany | 200/6 A |
| 2516296 | 5/1983 | France | 338/128 |

OTHER PUBLICATIONS

"Applying Linear Output Hall Effect Transducers", Microswitch, a Honeywell Division, Pub. 84 05704-A 980, pp. 1-4, 1982.

Primary Examiner—Roy N. Envall, Jr.
Assistant Examiner—C. N. Sears
Attorney, Agent, or Firm—Michael A. O'Neil

[57] ABSTRACT

In a contactless switch, a magnet is mounted on a rod for movement against the action of a spring to actuate a Hall effect switch. A contactless joy stick switch comprises a rod (20) supported and normally maintained in alignment with an axis (22) by an elastomeric spring (28). A plurality of Hall effect switches (42) are mounted in a circular array around the axis for actuation by a magnet (26) mounted on the rod upon displacement of the rod out of alignment with the axis. A contactless push button switch comprises a magnet (86) supported on a rod (74) which is supported for sliding movement along an axis (78) against the action of a spring (82). Displacement of the magnet (86) actuates a Hall effect switch (94). Another contactless push button switch (100) includes magnets (106, 108) positioned to actuate a Hall effect switch (110) upon sliding movement of a rod (74') against the action of a spring (82').

12 Claims, 5 Drawing Figures

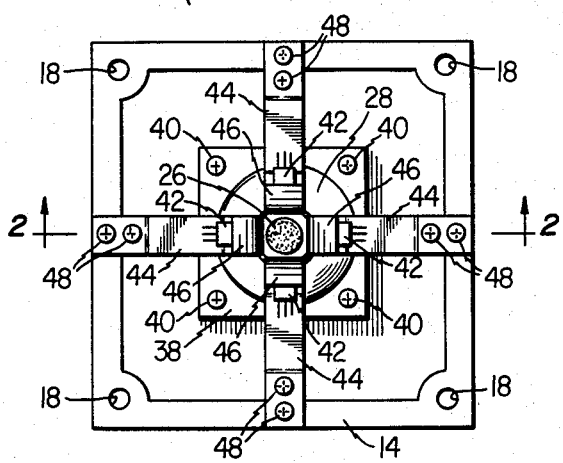
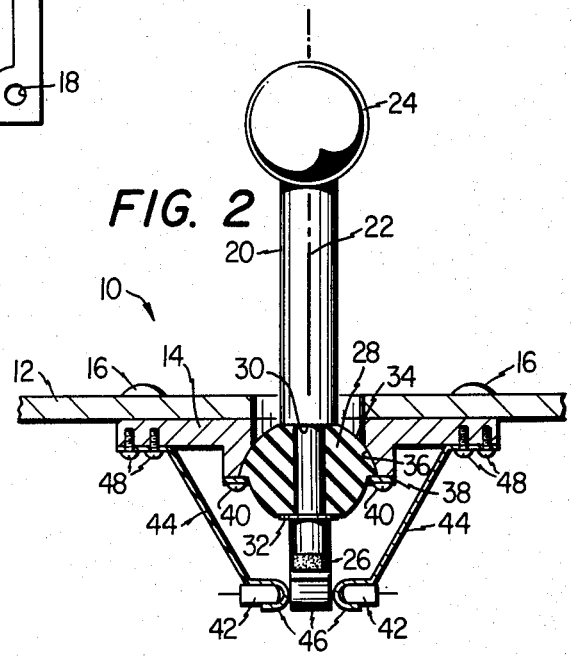
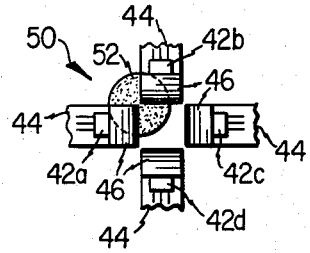
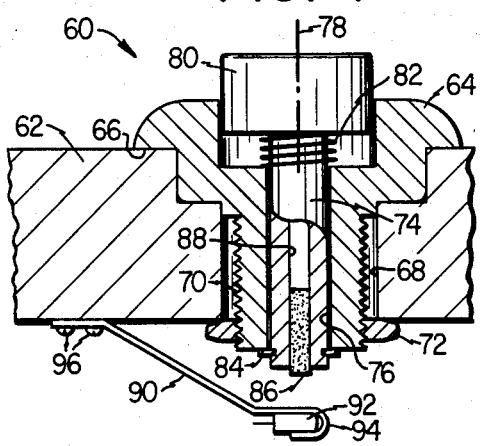

CONTACTLESS SWITCH AND JOYSTICK CONTROLLER USING HALL ELEMENTS

TECHNICAL FIELD

This invention relates generally to contactless switches, and more particularly to contactless switches that are particularly adapted for use in video games and in similar applications.

BACKGROUND AND SUMMARY OF THE INVENTION

Video games currently comprise an extremely popular form of entertainment. Most video games utilize switches to control game functions. For example, switches of the joy stick variety are often used to control direction of movement. Push button switches are used to control such functions as game mode selection, number of players, etc. In many video games push button switches are used to control the fire of simulated weapons.

In order to achieve commercial success, video games must be adapted for long term, substantially maintenance free service. One of the most common video game maintenance problems comprises the necessity of switch replacement or repair. This is because the contact-type switches that are currently used in video games are incapable of withstanding the literally hundreds of thousands of actuations which take place during a relatively short time span in the use of a popular video game.

The present invention overcomes the foregoing and other problems long since associated with the prior art by providing a contactless switch which is particularly adapted for use in video games. In accordance with the broader aspects of the invention, a Hall effect switch is positioned in a spaced apart relationship with respect to a magnet. Upon actuation of the switch, the magnet is moved into close proximity to the Hall effect switch. The contactless switch is thereby actuated to produce a predetermined output without the necessity of bringing the component parts of the switch into physical contact.

In accordance with more specific aspects of the invention, a contactless switch of the joy stick variety includes a rod which normally extends along a predetermined axis. A handle is positioned at one end of the rod, and a magnet is mounted at the other end. A plurality of Hall effect springs are positioned in an array around the axis of the rod. Upon actuation of the handle, the rod is displaced from the axis against the action of an elastomeric spring to bring the magnet into proximity with one or more of the Hall effect switches, thereby producing a predetermined output.

In accordance with another embodiment of the invention, a rod is supported for movement longitudinally along an axis. A push button is mounted at one end of the rod, and a magnet is mounted at the other end. A Hall effect switch is positioned in alignment with the axis and in a spaced apart relationship with respect to the magnet. Upon actuation of the push button the rod is moved longitudinally to bring the magnet into close proximity with the Hall effect switch, thereby producing a predetermined output.

In accordance with still another embodiment of the invention a rod is again mounted for longitudinal movement along an axis. A push button is mounted at one end of the rod and one or more magnets are mounted within the rod. A Hall effect switch is mounted adjacent the path of travel of the magnets within the rod. Upon manual operation of the push button the positioning of the magnets relative to the Hall effect switch is changed, thereby producing a predetermined output.

DESCRIPTION OF THE DRAWINGS

A more complete understanding of the invention may be had by reference to the following detailed description when taken in conjunction with the accompanying drawings, wherein:

FIG. 1 is a bottom view of a contactless switch comprising a first embodiment of the invention;

FIG. 2 is a sectional view taken along a line 2—2 in FIG. 1 in the direction of the arrows;

FIG. 3 is an illustration of a modification of the embodiment of FIG. 1;

FIG. 4 is a sectional view illustrating a second embodiment of the invention; and FIG. 5 is a sectional view illustrating a third embodiment of the invention.

DETAILED DESCRIPTION

Referring now to the drawings, and particularly to FIGS. 1 and 2 thereof, there is shown a contactless switch 10 incorporating a first embodiment of the invention. The switch 10 is of the joy stick variety, and is shown in FIG. 2 mounted on a panel 12 which may comprise part of a video game. As will be appreciated by those skilled in the art, the switch 10 is also adapted for use in applications other than video games, if desired.

The switch 10 includes a frame 14 which may be secured to the panel 12 by means of suitable fasteners 16. For example, the fastener 16 may comprise screws, rivets, or any other type of commercially available fastener in accordance with the requirements of particular applications of the invention. As is perhaps best shown in FIG. 1, the fasteners 16 are received in holes 18 formed in the frame 14.

Referring particularly to FIG. 2, the switch 10 further includes a rod 20 which normally extends along an axis 22. A handle 24 is mounted at one end of the rod 20. It will be understood that the particular shape of the handle 24 is not critical to the practice of the invention. A magnet 26 is mounted at the end of the rod 20 remote from the handle 24. The magnet 26 is secured to the rod by conventional means, for example, an adhesive layer may be used to secure the magnet 26 to the rod 20, or a fastener may be used.

The rod 20 extends through an elastomeric spring 28. The spring 28 supports the rod 20 on the frame 14 and also normally positions the rod 20 in alignment with the axis 22. The rod 20 is secured to the spring 28 by means of a shoulder 30 formed in the rod 20 and positioned in engagement with one side of the spring 28 and a snap ring 32 positioned in engagement with the opposite side of the spring 28. The snap ring 32 is received in a slot which is formed in the rod 20.

The spring 28 has a spherical surface 34 which engages a cooperative surface 36 formed in the frame 14. The surfaces 34 and 36 are secured in engagement with one another by a retainer 38. The retainer 38 is in turn secured to the frame 14 by a plurality of fasteners 40. For example, the fasteners 40 may comprise screws or other conventional fasteners.

The contactless switch 10 further includes a plurality of Hall effect switches 42. Each Hall effect switch 42 is supported by a bracket 44. Each bracket 44 has an end 46 which is crimped around its associated Hall effect switch 42. In the alternative, each Hall effect switch 42 may be mounted to its respective bracket 44 by epoxy glue, injection molding or other appropriate means, thus improving durability by reducing susceptibility to adverse affects of vibration, etc. The opposite end of each bracket 44 is secured to the frame 14 by means of suitable fasteners 48. For example, screws, rivets, or other conventional fasteners may be utilized to secure the brackets 44 to the frame 14.

The brackets 44 support the Hall effect switches 42 in a circular array around the axis 22. The rod 20 and the magnet 26 carried thereby are normally positioned in alignment with the axis 22. Therefore, the normal positioning of the magnet 26 relative to the Hall effect switches 42 is such that none of the Hall effect switches 42 is actuated.

Upon actuation of the handle 24 the rod 20 is displaced out of alignment with the axis 22 against the action of the spring 28. By this means the magnet 26 is brought into proximity with one of the Hall effect switches 42. When the positioning of the magnet 26 is sufficiently close to that of the selected Hall effect switch 42, the Hall effect switch is actuated. By this means the contactless switch 10 is actuated to produce a predetermined output in response to actuation of the handle 24. It will be understood that the contactless switch 10 is actuated to produce the predetermined output without the necessity of physical contact between any of the component parts of the switch 10.

Those skilled in the art will appreciate the fact that the contactless switch 10 shown in FIGS. 1 and 2 comprises a four-position joy stick. That is, the magnet 26 is adapted to actuate only one of the Hall effect switches 42 at any particular time. In certain applications of the invention the use of an eight-position joy stick will be considered desirable. In such instances the shape and dimensions of the brackets 44 and the shape and dimensions of the rod 20 can be varied in order to accommodate the positioning of eight Hall effect switches in a circular array around the axis 22. The operation of such an eight-position joy stick is then substantially identical to the operation of the four-position joy stick type contactless switch 10 shown in FIGS. 1 and 2.

FIG. 3 illustrates a contactless switch 50 which is substantially identical in construction and function to the contactless switch 10 illustrated in FIGS. 1 and 2. Substantially the only difference between the contactless switch 50 of FIG. 3 and the contactless switch 10 of FIGS. 1 and 2 is that the contactless switch 50 employs a magnet 52 which is substantially greater in diameter than the magnet 26 of the contactless switch 10.

The magnet 52 of the contactless switch 10 is dimensioned to permit actuation of adjacent Hall effect switches 42 simultaneously. Thus, when the magnet 52 is positioned as illustrated in FIG. 3, the Hall effect switches 42a and 42b are simultaneously actuated, while Hall effect switches 42c and 42d remain unactuated. The circuitry associated with the contactless switch 50 is programmed to recognize such a condition as equivalent to the actuation of a single Hall effect switch positioned between the Hall effect switches 42a and 42b in an application of the invention in which eight separate Hall effect switches are used. Thus, the contactless switch 50 is capable of producing a set of outputs identical to those produced by an embodiment of the invention utilizing eight separate Hall effect switches, but requires only four separate Hall effect switches to do so.

Referring now to FIG. 4, there is shown a contactless switch 60 incorporating a second embodiment of the invention. The contactless switch 60 is shown mounted in a panel 62 which may comprise part of a video game. Those skilled in the art will appreciate the fact that the contactless switch 60 is adapted for applications other than video games, if desired.

The contactless switch 60 includes a body 64 having a surface 66 which engages the upper surface of the panel 62. The remainder of the body 64 extends into and through an aperture 68 formed in the panel 62. The body 64 includes a threaded portion 70 which receives a nut 72 to secure the body 64 in the aperture 68 of the panel 62.

A rod 74 extends through a cylindrical aperture 76 formed through the body 64. The rod 74 is supported in the body 64 for longitudinal movement along an axis 78.

A push button 80 is secured to one end of the rod 74. A coil spring 82 is positioned around the rod 74 between the push button 80 and the body 64. The coil spring 82 urges the rod 74 to move upwardly along the axis 78. Upward movement of the rod 74 is limited by a snap ring 84 which is received in a groove formed in the rod 74.

A magnet 86 is mounted in the end of the rod 74 remote from the push button 80. The magnet 86 extends into an aperture 88 formed in the rod 74. The magnet 86 may be frictionally retained in the aperture 88. Alternatively, a suitable adhesive may be used to secure the magnet 86 in the aperture 88.

A bracket 90 supports a Hall effect switch 92 in alignment with the axis 78. The bracket 90 includes an end 94 which is crimped around the Hall effect switch 92. The opposite end of the bracket 90 is secured to the panel 62 by means of suitable fasteners 96. For example, screws may be used to secure the bracket 90 and the Hall effect switch 92 carried thereby to the panel 62.

The rod 74 and the magnet 86 carried thereby are normally positioned as shown in FIG. 4 under the action of the spring 82. When the magnet 86 is so positioned, it is sufficiently displaced from the Hall effect switch 92 that the Hall effect switch remains unactuated. When the push button 80 is depressed, the rod 74 and the magnet 86 carried thereby move downwardly against the action of the spring 82. Downward movement of the rod 74 moves the magnet 86 into proximity with the Hall effect switch 92, and when the positioning therebetween is sufficiently close the Hall effect switch 92 is actuated. In this manner the contactless switch 60 is actuated to produce a predetermined output without the necessity of physical contact between any of the component parts of the switch 60.

A contactless switch 100 comprising a third embodiment of the invention is illustrated in FIG. 5. Many of the component parts of the contactless switch 100 are substantially identical in construction and function to component parts of the contactless switch 60 shown in FIG. 4. Such identical components are designated in FIG. 5 with the same reference numerals utilized hereinabove in the description of the contactless switch 60, but are differentiated therefrom by means of a prime (') designation.

One differentiation between the contactless switch 100 and the contactless switch 60 comprises the structure utilized to retain the body 64' of the contactless switch 100 in the panel 62'. A snap ring 102 is received in a groove formed in the lower end of the body 64'. A coil spring 104 is positioned between the snap ring 102 and the underside of the panel 62'. Thus, the snap ring 102 and the spring 104 cooperate to secure the body 64' in the aperture 68' of the panel 62'. It will be appreciated that the threaded portion 70 and the nut 72 of FIG. 4 may be utilized to secure the body 64' of the contactless switch 100 if desired, and that the snap ring 102 and the spring 104 may be used to secure the body 64 of the contactless switch 60, if desired.

Two magnets 106 and 108 are mounted in the midportion of the rod 74' of the contactless switch 100. A Hall effect switch 110 is mounted in the body 64'. Upon depression of the push button 80', the rod 74' is moved downwardly against the action of the spring 82'. Downward movement of the rod 74' displaces the magnets 106 and 108 relative to the Hall effect switch 110. In this manner, the contactless switch 100 is actuated to produce a predetermined output. Again, the contactless switch 100 produces the predetermined output without the necessity of physical contact between any of the component parts thereof.

Although preferred embodiments of the invention have been illustrated in the accompanying drawings and described in the foregoing detailed description, it will be understood that the invention is not limited to the embodiments disclosed, but is capable of numerous rearrangements, modifications, and substitution of parts and elements without departing from the spirit of the invention.

I claim:

1. A contactless joy stick switch comprising:
   a rod having a lower portion of reduced diameter;
   handle means positioned at the upper end of the rod;
   magnet means mounted at the lower end of the rod;
   an elastomeric spring through which extends the lower portion of said rod, said spring being substantially spherical and having a downwardly facing lip extending outwardly about the circumference thereof, said spring normally positioning the rod in alignment with a predetermined axis and supporting the rod for displacement thereof out of alignment with the predetermined axis to move the magnet means in a circular pattern about the axis upon actuation of the handle means;
   a frame including a plate having an aperture through which said rod extends, said aperture having a flared lower surface against which the upper surface of said spherical spring abuts;
   a fastener mounted to said frame for engaging the lip of said spring and for urging said spring upwardly against the flared surface of the aperture of said frame;
   a plurality of Hall effect switches;
   means supporting the Hall effect switches in a circular array about the predetermined axis for actuation by the magnet means upon displacement of the rod out of alignment with the predetermined axis against the action of the spring means; and
   said spring means secured to said rod between the upper rod portion of larger diameter and a snap ring abutting the lower end of said spring.

2. The contactless joy stick switch according to claim 1 further characterized by a frame, wherein the spring means supports the rod on the frame, and further including bracket means for supporting the Hall effect switches on the frame.

3. The contactless joy stick switch according to claim 1 wherein the spring means comprises an elastomeric spring.

4. The contactless joy stick switch according to claim 1 further characterized by four Hall effect switches positioned at substantially 90° intervals about the predetermined axis.

5. The contactless joy stick switch according to claim 4 wherein the magnet means is dimensioned for actuation of adjacent Hall effect switches simultaneously.

6. The contactless joy stick switch according to claim 1 further including:
   frame means;
   means securing the spring means to the frame means so that the spring means supports the rod on the frame means; and
   bracket means for supporting the Hall effect switches on the frame means.

7. The contactless joy stick switch according to claim 6 wherein the spring means comprises an elastomeric spring.

8. The contactless joy stick switch according to claim 7 further characterized by four Hall effect switches positioned at substantially 90° intervals about the predetermined axis.

9. The contactless joy stick switch according to claim 8 wherein the magnet means is dimensioned for simultaneous actuation of adjacent Hall effect switches.

10. The contactless joy stick switch according to claim 6 wherein the magnet means is dimensioned for simultaneous actuation of adjacent Hall effect switches.

11. A contactless push button switch for use in a panel having an aperture formed therethrough comprising:
    an elongate tubular body having an aperture extending therethrough, said body being externally threaded adjacent the lower end thereof;
    a fastener engaging the threads of said body for securing the body in the aperture extending through the panel;
    a rod positioned in the aperture through the body for sliding movement longitudinally along a predetermined axis, said rod having a length approximating the length of the aperture of said body;
    a push button secured to one end of the rod;
    spring means positioned between the body and the push button for biasing the rod for movement in a predetermined direction along the predetermined axis;
    means for retaining said rod within said body;
    magnet means secured in the end of the rod remote from the push button;
    a Hall effect switch; and
    bracket means supporting the Hall effect switch in alignment with the predetermined axis at a point substantially displaced from the normal positioning of the magnet means under the action of the spring means and for actuation by the magnet means upon movement of the rod and the magnet means carried thereby along the predetermined axis against the action of the spring means in response to actuation of the push button.

12. A push button contactless switch for use in conjunction with a panel having an aperture formed therethrough comprising:
    an elongate tubular body having an aperture formed therethrough, said body having a retaining groove extending about the lower end thereof;

a snap ring engaging said retaining groove for securing the body in the aperture formed through the panel;

a spring mounted between said snap ring and said panel for holding said body within the panel;

a rod positioned in the aperture in the body for sliding movement along a predetermined axis, said rod having a length approximating the length of the aperture of said body;

a push button secured to one end of the rod;

spring means positioned between the body and the push button for biasing the rod for movement in a predetermined direction along the predetermined axis;

means for retaining said rod within said body;

at least one magnet mounted in the rod for movement therewith back and forth along the predetermined axis;

a Hall effect switch mounted in the body adjacent the path of movement of the magnet in the rod; and said Hall effect switch being normally substantially displaced from the magnet and positioned for actuation by the magnet upon movement of the rod along the axis against the action of the spring means responsive to actuation of the push button.

* * * * *